United States Patent [19]

Nuzillat et al.

[11] Patent Number: 4,514,649
[45] Date of Patent: Apr. 30, 1985

[54] HIGH-ENTRANCE HIGH-SPEED LOGIC OPERATOR WHICH HAS A COMPLEX DIGITAL FUNCTION AND UTILIZES AT LEAST ONE QUASI-NORMALLY OFF MESFET

[75] Inventors: Gérard Nuzillat; Georges Bert, both of Paris, France

[73] Assignee: Thomson-CSF, Paris, France

[21] Appl. No.: 265,918

[22] Filed: May 21, 1981

[30] Foreign Application Priority Data

May 23, 1980 [FR] France .................. 80 11550

[51] Int. Cl.³ ............... H03K 19/017; H03K 19/094; H03K 19/20
[52] U.S. Cl. ................................ 307/450; 307/446
[58] Field of Search ............... 307/446, 448, 450, 458

[56] References Cited

U.S. PATENT DOCUMENTS 4,300,064 11/1981 Eden ................................ 307/450 X
4,394,589 7/1983 Pham et al. ....................... 307/450

OTHER PUBLICATIONS

IEEE Int'l Solid State Circuits Conference, Feb. 1980, N.Y. Eden et al.: "Multi-Level Logic Gate Implementation in GaAs ICs using Schottky Diode-FET Logic" pp. 122–123 & 265–266.
IEEE Spectrum, vol. 14, No. 3 Mar. 1977, New York; Van Tuyl et al., "Gallium Arsenide Spawns Speed" pp. 41–47.
IEEE Transactions on Electron Devices, vol. ED-27, No. 6, Jun. 1980 New York; Nuzillat et al., "Quasi-Normally-Off MESFET Logic for High-Performance GaAs IC's".
Zuleeg et al., "Femtojoule High-Speed Planar GaAs E-JFET Logic"; IEEE Trans. on Electron Devices; vol. Ed-25, No. 6, pp. 628–639; 6/1978.
Nuzillat et al., "LSI Oriented Logic Approach Using Quasi-normally off GaAs MESFETs"; IEEE Proc., vol. 127, Pt. I, No. 5, pp. 287–296; 10/1980.
Van Tuyl et al., "High-Speed Integrated Logic with GaAs MESFETs"; IEEE-JSSC, vol. SC-9, No. 5, pp. 269–276; 10/1974.

Primary Examiner—Larry N. Anagnos
Attorney, Agent, or Firm—Oblon, Fisher, Spivak, McClelland & Maier

[57] ABSTRACT

In the field of large-scale-integrated digital GaAs circuits, a high-entrance high-speed logical operator utilizing so-called "quasi-normally-off" Schottky-gate field-effect transistors (MESFETS) having a low threshold voltage. By means of a single very-high-speed logic gate, the operator thus performs AND - NAND - OR functions by utilizing in an input branch a saturable resistive load in series with a pair of quasi-normally-off MESFET's each having a maximum of two Schottky gates, the drains of the transistors being connected to an output transistor of the same type. Two identical portions of circuit are mounted in parallel with an output half-branch comprising a diode in series with another saturable resistive load.

4 Claims, 17 Drawing Figures

OR-AND-NOR

OR-AND-NOR

OR-NAND

OR-NAND

NOR

NOR

NAND

NAND

HIGH-ENTRANCE HIGH-SPEED LOGIC OPERATOR WHICH HAS A COMPLEX DIGITAL FUNCTION AND UTILIZES AT LEAST ONE QUASI-NORMALLY OFF MESFET

BACKGROUND OF THE INVENTION

This invention relates to the integrated-circuit fabrication of high performance logic operators derived from logic inverters which make use of Schottky-gate field-effect transistors (MESFET's) having a low threshold voltage, especially operators which achieve up to three logic levels per gate and have a high entrance.

It is known that, in a complex logic gate, there can be distinguished a number of logic levels or layers corresponding to the number of elementary operators on the path of the logic signals. When the elementary operators are active components such as diodes and transistors, the digital signal experiences a time-delay as it passes through each operator. In order to improve the speed of the logic circuit, it is therefore an advantage to reduce the number of logic layers. Furthermore, the aim of the invention is to improve the entrance or in other words to permit simultaneous control of the operator by means of a large number of inputs without any impairment of operational safety, even in the presence of noise.

Field-effect transistors of the so-called "normally-on" or "normally-off" type are already known. Normally-on transistors operate in the depletion mode, which calls for double-polarity supply and also has the disadvantage of consuming power in the quiescent state. Normally-off transistors permit the passage of current when a suitable voltage is applied to the control gate; thus they do not require a double-polarity supply and are more economical. On the other hand, they are difficult to construct by reason of the very small thickness of the conduction channel and give rise to a large number of production rejects.

A third class of field-effect transistors which is in an intermediate category between the two classes mentioned above while being more closely related to the second class consists of quasi-normally-off transistors. These transistors have a threshold voltage $V_T$ which can be either positive or negative; this means that a certain degree of dispersion is tolerated in the collective manufacture of these transistors and is, for example, as follows:

$$-0.4 \leq V_T \leq 0.2 \text{ volt.}$$

The third class of transistor is easier to fabricate than the second class but more difficult to use in practice. It is known to construct transistors having a low threshold voltage wherein a trench is cut by ionic erosion between the source and the drain, thus constituting a saturable resistor having very low power consumption which can be converted to a field-effect transistor by depositing a metallized coating at the bottom of the trench at the control gate location so as to perform the function of this latter. However, transistors fabricated by means of this technology exhibit a certain degree of dispersion and are therefore subject to certain disadvantages by reason of the dispersion of characteristics. Thus the threshold voltage is sometimes positive and sometimes negative; in the event that the voltage is negative, the input transistor is not pinched-off, thereby producing a reduction of entrance and making it impossible in practice to form multiple inputs.

BRIEF SUMMARY OF THE INVENTION

The logic operator according to the invention is of the multiple-input type which is intended to be supplied from a single source. The operator comprises an articulation of branches and/or half-branches each constituted by at least one of the three following elements:

a field-effect transistor having a low threshold voltage and determined hereinafter by the abbreviation LTT;

a diode;

a resistive load (which can be a saturable resistor of the type defined in the foregoing).

The typical operator is distinguished by the fact that it comprises in parallel:

either two or three LTTs each having a maximum of two control gates which are intended to perform the function of logic operator inputs;

or a number of diodes which is limited to two per half-branch;

or two identical portions of circuit each constituted by an articulation of branches and/or half-branches each provided with at least one of said elements.

BRIEF DESCRIPTION OF THE DRAWINGS

These and other features of the invention will be more apparent upon consideration of the following description and accompanying drawings, wherein.

DETAILED DESCRIPTION OF THE PREFERRED EMBODIMENTS

Figure 1:
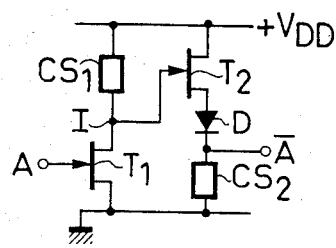
FIG. 1 illustrates a known type of logic inverter comprising LTTs.

In FIG. 1, there is shown a logic inverter whose input A is connected to the control gate of a transistor $T_1$ which is of the LTT type. The source of said transistor is connected to ground, the drain is connected to the node I which is in turn connected to the hot point corresponding to one pole (the positive pole in this example) of a source $V_{DD}$ through a resistive load $CS_1$. The example chosen corresponds to the case of the transistor having a channel n. In the case of a channel p, the polarities must be reversed.

The node I is connected to the gate of a transistor $T_2$ which is a LTT. The drain of the transistor $T_2$ is connected to the pole $+V_{DD}$, the source of said transistor is connected to a diode D which is in the conducting state in the direction considered from $+V_{DD}$ to ground. Return to ground takes place via a resistive load $CS_2$ of the same type as $CS_1$. The output A of the inverter is brought out between D and $CS_2$.

The operating principles of the inverter will be briefly recalled. When the input A is in state "0" (zero or slightly positive potential), the transistor $T_1$ is in the cutoff or quasi-cutoff state. The potential at the node I is close in value to that of the pole $+V_{DD}$. Since the gate-source junction of the transistor $T_2$ is forward-biased, the source potential tends to rise as is also the case with the output $\overline{A}$ but with a voltage shift produced by the diode. The output is thus in state "1" and at a potential which is positive by virtue of the presence of the resistive load $CS_2$.

When the input A is in state "1" (for example in the vicinity of 0.8 volt), the potential of the node I is of low value, namely of the same order of magnitude as the offset voltage of the transistor $T_1$, and the transistor $T_2$ is consequently cut-off by its gate. It is shown that, by virtue of the presence of the diode D, the output potential $\overline{A}$ is in the vicinity of ground potential (state "0").

It can readily be demonstrated that the operation of the inverter is correct if the threshold voltage is between the following limits;

$$-0.4 \text{ V} \leq V_T \leq +0.2 \text{ V}$$

It is further apparent that, if an input is added by making use of a two-control gate transistor $T_1$, thus providing a two-input NAND-type gate, the operation remains satisfactory and provides a certain margin of good operation in spite of the inevitable noise in the input signal.

A good appreciation of this margin is obtained by evaluating the ratio of the residual current $I_{res}$ in the state "0" in the unfavorable case in which $V_T = -0.4$ V to the maximum current $I_{max}$ in state "1".

In point of fact, by reason of the guadratic "voltage/current" characteristic of field-effect transistors, we have the following relation:

$$I_{res}/I_{max} = (V_T/V_p)2 \tag{1}$$

where $V_T$ is the threshold voltage of the LTT and $V_p$ is the maximum gate-source voltage reduced by the threshold voltage.

In the case of a single input, if $V_p = 0.8 + 0.4 = 1.2$ volt, we have:

$$I_{res}/I_{max} = 1/9 \tag{2}$$

In the case of n inputs, we have:

$$I_{res}/I_{max} = n/9 \tag{3}$$

It is apparent that, above three inputs, the ratio is $\frac{1}{3}$, namely 33%. The margin is considered insufficient in this case, with the result that the number of inputs, for instance the number of control gates, has to be limited to two.

Figure 2:
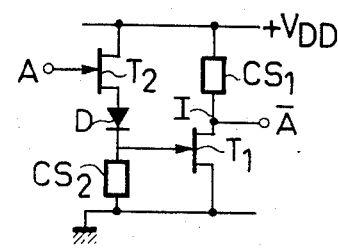
FIGS. 2 to 6 illustrate conventional or novel alternative forms of logic inverters which make use of at least one LTT.

It will become readily apparent that the alternative embodiments of the inverter of FIG. 1 as illustrated in FIGS. 2 to 6 are very similar both in regard to the operation and limitation imposed on the number of inputs The inverter of FIG. 2 is an operator which makes use of the circuit of FIG. 1 after reversal of the input branch and of the output branch. Furthermore, the general result achieved is exactly the same as if the "node I-gate $T_2$" connection had been cut in this process of reversal in order to establish the new input A on the control gate $T_2$ and the new output $\overline{A}$ on the node I. It could readily be shown that the potentials are the same as in the case of the inverter of FIG. 1 when changing over from state "0" to state "1" and conversely both at the input and at the output.

Figure 3:
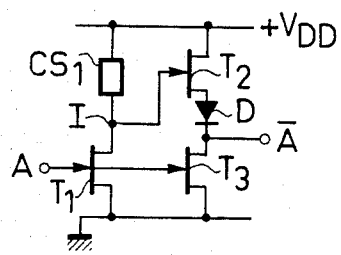

The inverter of FIG. 3 is an operator in which the circuit employed is similar to that of FIG. 1 but in which the resistive load $CS_2$ is replaced by a transistor $T_3$, namely a LTT which is identical with the transistor $T_1$ and the gate of which is connected directly to the input A in the same manner as the gate of the transistor $T_1$, thus permitting an increase in speed.

Figure 4:
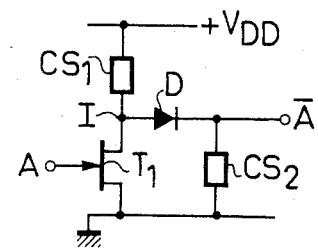

The inverter of FIG. 4 is an operator in which the circuit employed is distinguished from that of FIG. 1 by the fact that the transistor $T_2$ as well as the direct connection between the drain of the transistor $T_1$ and the diode D have been dispensed with.

Figure 5:
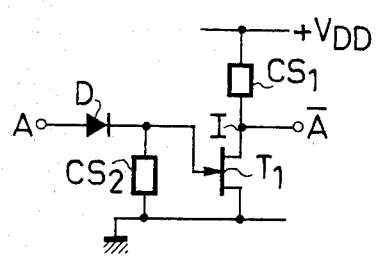

The inverter of FIG. 5 is an operator in which the circuit of FIG. 4 is employed by reversing the input branch and the output branch. The result achieved by this reversal is exactly the same as if the connection between the node I and the diode D had been cut in order to establish the new input on the diode and the new output at the node I.

Figure 6:
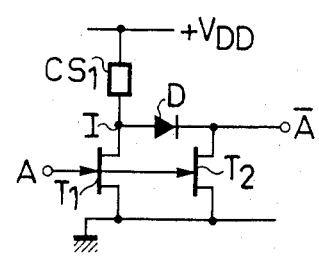

The inverter of FIG. 6 is an operator in which the circuit of FIG. 4 is employed by replacing the load $CS_2$ by a LTT, the gate of which is connected directly to the input A in the same manner as the gate of the transistor $T_1$, thus permitting an increase in speed.

FIRST EXAMPLE

A first exemplified embodiment of the invention will now be given below.

Figure 7:
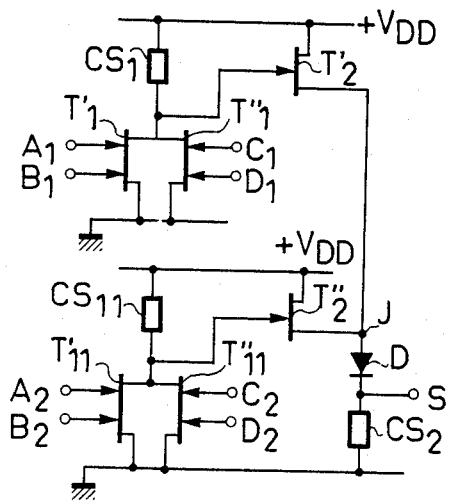
FIG. 7 is one example of construction of an eight-input logic operator in accordance with the invention.
Figure 8:
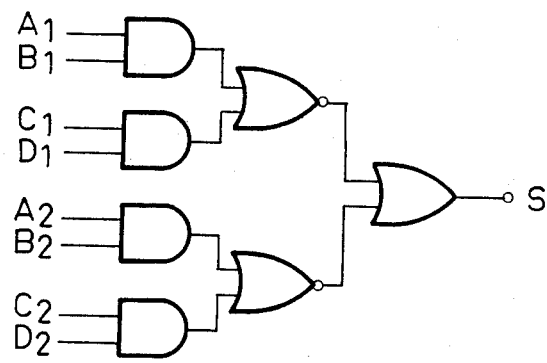
FIG. 8 is a functional diagram of a complex logic gate formed by the operator of the previous figure.

As shown in FIG. 7, a logic operator derived from an inverter of FIG. 1 and having eight inputs has been constructed so as to perform the function:
AND-NOR-OR (FIG. 8) or
AND-OR-NAND The diagram of this operator comprises branches and half-branches which are articulated in the same manner as in FIG. 1 but in which the transistor gates, the transistors themselves and portions of the circuits composed of three half-branches are connected in parallel.

The following procedure was adopted:

(1) In a first portion of circuit, two LTT transistors, namely $T'_1$ and $T''_1$ having two control gates ($A_1$, $B_1$ in the case of $T'_A$ and $C_1$, $D_1$ in the case of $T''_1$) are mounted in parallel in one input half-branch. The portion of circuit is then completed by an input half-branch of the resistive load type ($CS_1$) and by an output half-branch containing a transistor $T'_2$;

(2) In a second portion of circuit, two other transistors $T'_{11}$ and $T''_{11}$ each having two control gates ($A_2$, $B_2$ $C_2$ and $D_2$) are mounted in a similar manner; the second portion of circuit is then completed in the same manner as the first by a resistive load $CS_{11}$ and a transistor $T''_2$.

(3) The transistors $T'_2$ and $T''_2$ of said half-branches are then connected in parallel via a node J with an output half-branch comprising a diode D and a resistive load $CS_2$ of the type shown in FIG. 1, the output terminal S being brought out between the diode D and the load $CS_2$.

The logic functions of the operator thus obtained can readily be deduced from the fact that the successive parallel connections considered one by one would produce, if they were alone, the equivalent of an OR function in the case of two transistors and of an AND function in the case of two input gates of a "quasi-normally-off" transistor, the inversion (NOT gate) which is inherent in the basic circuit being also taken into account.

It is found experimentally that, in spite of the increase in the number of functions and inputs of the operator, the margin of operation in the presence of noise is of the same order as that of a simple inverter of the type shown in FIG. 1 and provided with only one input transistor having two gates.

One possible explanation appears to arise from observations of a statistical order at the time of fabrication of a plurality of transistors having the same geometrical characteristics and so arranged as to occupy a small region of one and the same semiconductor crystal wafer. In fact, the electrical characteristics of transistors of this type are usually extremely similar. This is therefore the case with the characteristic which is constituted by the threshold voltage $V_T$ of LTTs and plays a decisive role in the margin of operation.

It follows from the foregoing observations that usually an operator constituted by very similar LTTs on the wafer will consist of only good or bad LTTs (that is, non-standard elements) but will not consist of alternately good and bad LTTs. This constitutes a statistical factor which is conducive to efficient production of integrated circuits comprising logic operators according to the invention.

SECOND EXAMPLE

Figure 9:
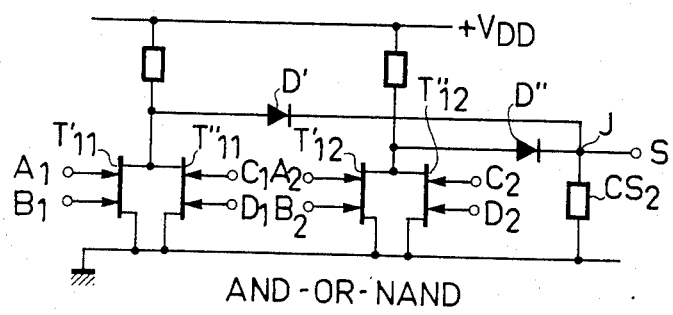
FIGS. 9 to 17 illustrate further embodiments of logic operators in accordance with the invention.

In a second embodiment according to the invention, there is shown in FIG. 9 an operator having eight inputs and derived from the inverter of FIG. 4. This operator performs the function:

AND-OR-NAND

This operator is obtained by connecting two control gates in parallel (inputs $A_1$ and $B_1$, $C_1$ and $D_1$, $A_2$ and $B_2$, $C_2$ and $D_2$) in each of the transistors of type $T_1$ (see FIG. 4) which are mounted in parallel pairs, namely respectively $T'_{11}$ and $T''_{11}$, $T'_{12}$ and $T''_{12}$. The two input branches and their connecting diodes $D'$ and $D''$ form two portions of circuit which are connected in parallel at the node J to a single load $CS_2$, the output being brought out from said node J.

It is noted that the operator of this second example performs the same logic functions as the operator of the first embodiment but with two transistors less.

Observations similar to those of the first example have been made in regard to noise resistance and production efficiency.

THIRD EXAMPLE

Figure 10:
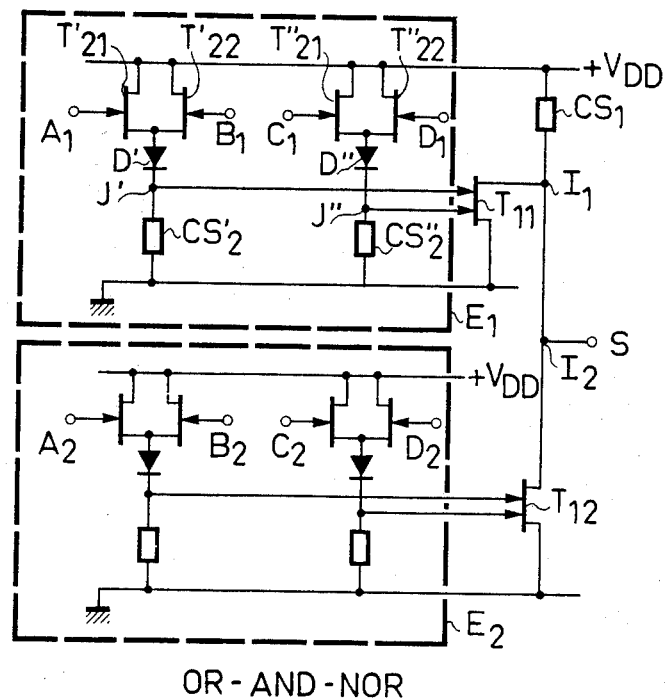

In a third exemplified embodiment of the invention, there is shown in FIG. 10 an eight-input operator derived from an inverter of FIG. 2. This operator performs the following function:

OR-AND-NOR

This operator is obtained by forming two portions of circuit $E_1$ and $E_2$. Each portion contains in an identical manner (shown without reference in portion $E_2$):

two transistors $T'_{21}$ and $T'_{22}$ of the type shown in FIG. 2 and connected in parallel with a half-branch comprising in series a diode $D'$ and a load $CS'_2$;

two transistors $T''_{21}$ and $T''_{22}$ of the type $T_2$ of FIG. 2 and connected in parallel with a half-branch comprising in series a diode $D''$ and a load $CS''_2$.

The portions of circuit $E_1$ and $E_2$ are completed respectively by a half-branch containing a transistor of type $T_1$ of FIG. 2, namely the transistors $T_{11}$ and $T_{12}$ each having two control gates connected respectively to nodes $J'$ and $J''$ for connecting one input half-branch between a diode ($D'$, $D''$) and a load ($CS'_2$, $CS''_2$).

The transistors $T_{11}$ and $T_{12}$ are connected in parallel at the nodes $I_1$ and $I_2$ which are connected to each other as well as to the output S of the operator and to the opposite terminal of the load $CS_2$ with respect to the terminal connected to the pole $+V_{DD}$ of the supply.

FOURTH EXAMPLE

Figure 11:
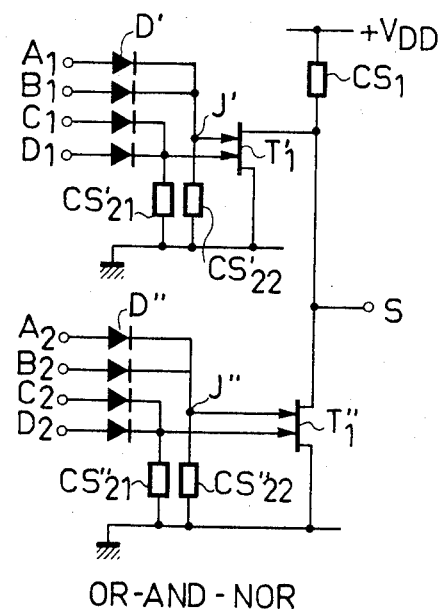

In a fourth embodiment, there is shown in FIG. 11 an eight-input operator derived from an inverter of the type illustrated in FIG. 5. This inverter performs the following function;

OR-AND-NOR

This operator is obtained by forming two groups of four diodes $D'$ and $D''$ connected respectively between the input terminals of the operator ($A_1$, $B_1$, $C_1$, $D_1$, $A_2$, $B_2$, $C_2$, $D_2$) which are divided into two groups, said groups being in turn subdivided into two pairs. Each pair is connected in parallel with a load of the type $CS_2$ ($CS'_{21}$ and $CS'_{22}$ in the case of one group, $CS''_{21}$ and $CS''_{22}$ in the case of the other group).

If the input terminals of the loads $CS'_{21}$ and $CS'_{22}$ on the one hand and the loads $CS''_{21}$ and $CS''_{22}$ on the other hand are designated as $J'$ and $J''$ respectively, the terminals $J'$ (or $J''$) are connected to two gates of transistors of the type $T_1$ ($T'_1$ and $T''_1$), the drains of which are connected in parallel to the output S and to the opposite terminal of the load CS with respect to the pole $+V_{DD}$ of the supply.

FIFTH EXAMPLE

Figure 12:
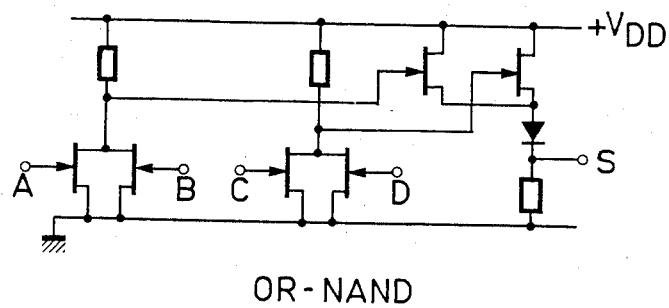

In a fifth embodiment, there is shown in FIG. 12 a four-input operator which is similar to that of the first example and in which provision is made for input transistors having only one gate instead of two gates, thus reducing the number of inputs but also the logic functions which are then limited to:

OR-NAND

SIXTH, SEVENTH AND EIGHTH EXAMPLES

Figure 13:
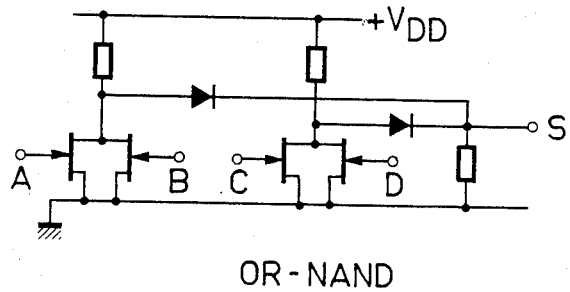

In these embodiments (shown in FIGS. 13, 14 and 15), the operators have four inputs and are similar respectively to the operators of the second, third and fourth examples in which input transistors having a single gate were employed. These operators carry out only the following logic functions:

OR-NAND in the case of FIG. 13

Figure 14:
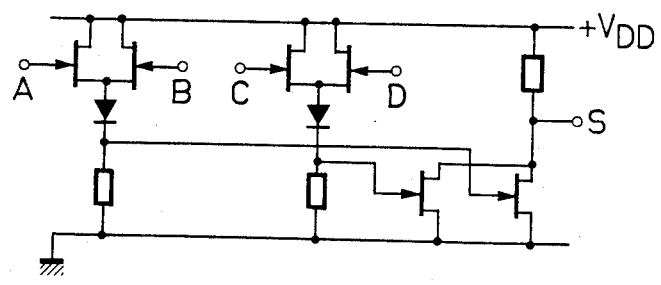
Figure 15:
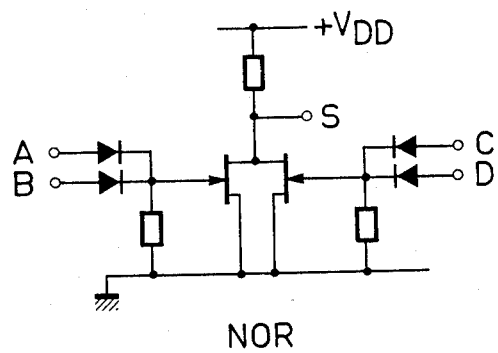

NOR in the case of FIGS. 14 and 15.

NINTH AND TENTH EXAMPLES

Figure 16:
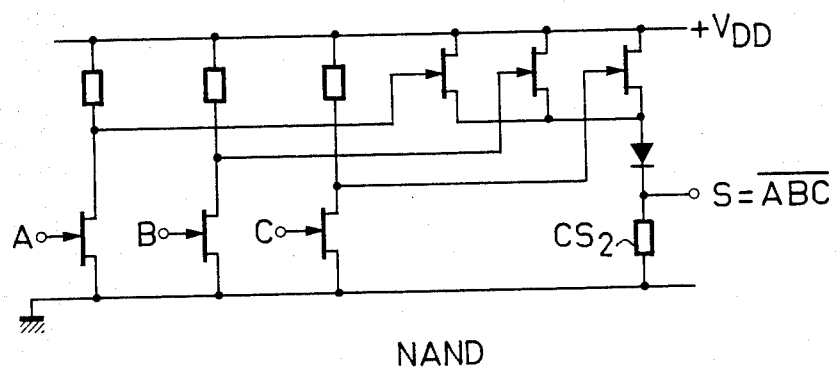
Figure 17:
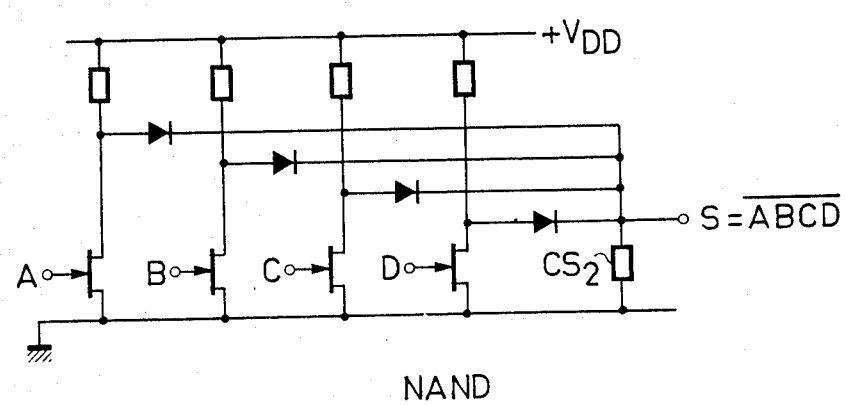

In the embodiments of FIGS. 16 and 17, there are shown three-input and four-input operators derived respectively from the inverter of FIG. 1 and from the inverter of FIG. 4 by connecting in parallel portions of circuit comprising the basic inverter but in which provision is no longer made from the output branch comprising the load. This parallel connection is carried out with the terminal S connected to that terminal of the load $CS_2$ which is not connected to ground.

In both cases, the logical function thus performed is the following:

NAND.

What is claimed is:

1. A multiple-input high-speed logic operator which is supplied from a single source, said operator comprising two portions of circuit mounted in parallel and furthermore connected to one output half-branch, each portion of circuit being such as to comprise, in series between one pole of the source and ground, an input half-branch constituted by a first resistive load connected to said pole, and an input half-branch connected to ground and constituted by the parallel connection of two quasi-normally-off low threshold field-effect transistors each having a maximum of two control gates constituting the inputs of the operator, each portion of circuit being further provided with a third transistor whose gate is connected to the common node of the two input half-branches, the drain of said third transistor being connected to said pole and the source of said third transistor being connected to ground through said output half-branch constituted by the series connection of a diode with a second resistive load, the output of the operator being brought out between the diode and said second resistive load, said diode being located on the side opposite to ground with respect to said second resistive load and being conductive in the direction considered from said pole to ground.

2. The logic operator of claim 1 wherein each field-effect transistor in each of the parallel-connected field-effect transistors of said input half-branches having a single control gate constituting as an input of the operator.

3. A multiple-input high-speed logic operator which performs a plurality of logic functions and which is supplied by a single source of voltage, comprising:

a plurality of input branches with each input branch including a saturable resistive load in series with the parallel connection of a pair of quasi-normally-off MESFET's, with each of said MESFET's having a maximum of two schottky gates, with said MESFET's being connected in parallel; and wherein each input branch including an output node at the connection of the resistive load to the parallel-connected MESFET's; and a common output half-branch, operatively connected to said plurality of output nodes, including a diode in series with a second saturable resistive load.

4. A multiple-input high-speed logic operator, utilizing quasi-normally-off field-effect transistors which are supplied by a single source of power wherein said operator comprises;

at least two output, quasi-normally-off field-effect transistors with each of said transistors having a low threshold voltage and with each of said transistors comprising at least one gate for receiving a respective logic signal in response to logic action of an individual input logic circuit branch and wherein the output of said operator is connected to a wired OR logic function means which links each of the respective sources of said transistors.

* * * * *